(12) United States Patent
Kravtchenko et al.

(10) Patent No.: US 6,229,181 B1
(45) Date of Patent: May 8, 2001

(54) SEMICONDUCTOR DEVICE AND METHOD OF FORMING A SEMICONDUCTOR STRUCTURE TO PROVIDE ELECTROSTATIC DISCHARGE PROTECTION

(75) Inventors: Dmitri G. Kravtchenko; Anatoly U. Paderin, both of Moscow (RU)

(73) Assignee: Digital Devices, Inc., North Miami, FL (US)

( * ) Notice: Subject to any disclaimer, the term of this patent is extended or adjusted under 35 U.S.C. 154(b) by 0 days.

(21) Appl. No.: 09/303,715

(22) Filed: Apr. 30, 1999

(51) Int. Cl.[7] ..................................................... H01L 23/62
(52) U.S. Cl. ............................................................ 257/355
(58) Field of Search ..................................... 438/237, 141; 257/356, 328, 762, 355, 149, 215

(56) References Cited

U.S. PATENT DOCUMENTS

| 4,170,017 | 10/1979 | Klein et al. . |
|---|---|---|
| 5,227,012 | 7/1993 | Brandli et al. . |
| 5,355,014 | 10/1994 | Rao . |
| 5,468,984 | * 11/1995 | Efland et al. .......................... 257/356 |
| 5,770,886 | 6/1998 | Rao . |

* cited by examiner

Primary Examiner—Matthew Smith
Assistant Examiner—Calvin Lee
(74) Attorney, Agent, or Firm—Jeffrey Weiss; Jeffrey D. Moy; Weiss & Moy, P.C.

(57) ABSTRACT

An improved semiconductor device is disclosed for protecting active and passive devices against electrostatic discharge (ESD). The device is an improved semiconductor diode having anode, injector and ohmic contact regions located within a cathode region. The improved semiconductor diode allows for ESD higher currents without damage to active or passive devices including, for example, resistor-capacitor networks or resistor-capacitor-inductor networks incorporating the improved semiconductor diode.

6 Claims, 2 Drawing Sheets

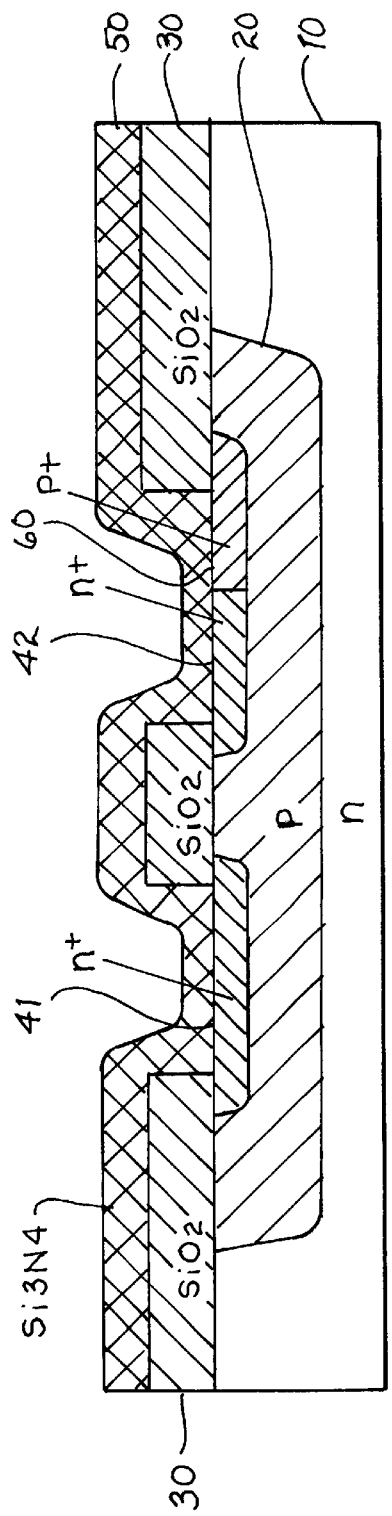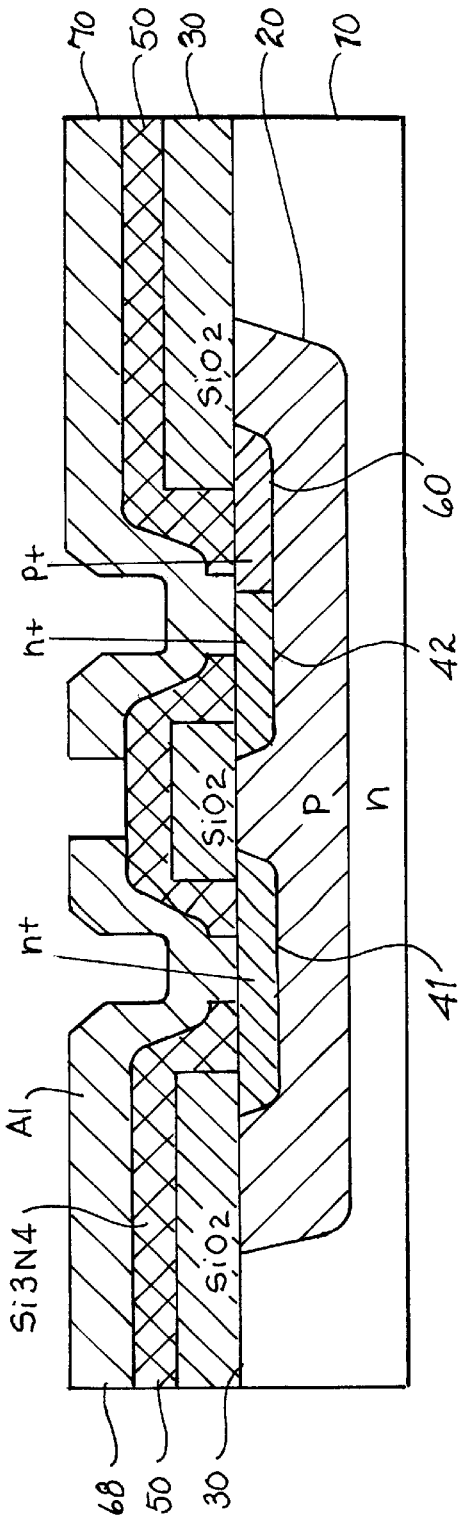

SEMICONDUCTOR DEVICE AND METHOD OF FORMING A SEMICONDUCTOR STRUCTURE TO PROVIDE ELECTROSTATIC DISCHARGE PROTECTION

CROSS-REFERENCE TO RELATED APPLICATIONS

This application is related to U.S. patent applications entitled Zener Diode And RC Network Combination Semiconductor Device For Use In Integrated Circuits and Method Therefor and RC Networks In Semiconductor Devices And Method Therefor, which are filed concurrently with the present U.S. patent application. The present U.S. patent application and the related Applications are assigned to the same assignee.

BACKGROUND OF THE INVENTION

1. Field of the Invention

This invention generally relates to semiconductor devices and integrated circuits that require electrostatic discharge (hereinafter referred to as "ESD") protection. In typical electrical circuits, such devices include Resistor-Capacitor (hereinafter referred to as "RC") or Resistor-Capacitor-Inductor (hereinafter referred to as "RCL") networks and fabrication methods therefor. Specifically, this invention relates to an improved semiconductor device and a method for manufacturing such an improved semiconductor device which provides protection against ESD for active or passive devices or any type of integrated circuit.

2. Description of the Related Art

In the past art, the primary method for integrating protection of ESD in RC Network types of semiconductor devices was to use or incorporate certain types of diodes, i.e. Schottky diodes and Zener diodes to provide for ESD protection. For example, Rao et al. (U.S. Pat. Nos. 5,355,014 and 5,770,886) employs a Schottky diode for ESD protection.

However, one primary disadvantage of the use of a Schottky/Zener diode technique for ESD protection is the added complexity of the process flow for manufacturing these fairly complicated semiconductor devices. The prior art semiconductor process for fabricating these types of semiconductor devices usually required an epitaxy growth process step to obtain or form regions of P type conductivity, formation of the LOCOS field isolation and formation of a multi-layer metalization system on the backside of the semiconductor wafer.

Therefore, a simpler, more cost effective and more reliable semiconductor device and semiconductor process solution was needed or required as contrasted to both the semiconductor device and process complexity incurred by the incorporation of Schottky/Zener diodes to provide ESD protection for use with, for example, RC network semiconductor devices.

BRIEF SUMMARY OF THE INVENTION

It is an object of the present invention to provide an improved semiconductor structure and method for protecting an active or passive device against ESD.

It is another object of the present invention to provide an improved semiconductor structure and method for protecting an integrated circuit device against ESD.

It is another object of the present invention to provide an improved semiconductor structure and method for protecting an active or passive network against ESD which provides a simpler, more cost effective and more reliable solution than the prior use of a Schottky diode for ESD protection.

It is still another object of the present invention to provide an improved semiconductor structure and method for protecting an active or passive network against ESD which provides a simpler, more cost effective and more reliable solution than a Zener diode for ESD protection.

It is a further object of the present invention to provide an improved semiconductor structure for protecting an active or passive network against ESD which utilizes a simpler, more cost effective and more reliable type of semiconductor device structure which is an improved diode comprising an anode, cathode and injector.

BRIEF DESCRIPTION OF THE PREFERRED EMBODIMENT

In accordance with one embodiment of the present invention, a semiconductor diode is provided for protection of active or passive devices against electrostatic discharge comprising a P well cathode located within an N type substrate, an N+ type anode region located within the P well cathode, an N+ type injector region located within the P well cathode and spaced from the N+ type anode region, a P+ type ohmic contact region located within the P well cathode and in contact with the N+ type injector region, a first metal electrode in electrical contact with a surface portion of the N+ type anode region, and a second metal electrode in electrical contact with surface portions of both the N+ type injector region and the P+ type ohmic contact region which are adjacent and co-planar to each other. The improved diode is preferably fabricated in a single, monolithic integrated circuit made of silicon.

In accordance with another embodiment of the invention, a method is disclosed for fabricating a semiconductor device structure for protection of active or passive devices against ESD which comprises the steps of forming a P well cathode located within an N type substrate, forming an N+ type anode region located within the P well cathode, forming an N+ type injector region located within the P well cathode and spaced from the N+ type anode region, forming a P+ type ohmic contact region located within the P well cathode and in contact with the N+ type injector region, forming a first metal electrode in electrical contact with a surface portion of the N+ type anode region, and forming a second metal electrode in electrical contact with surface portions of both the N+ type injector region and the P+ type ohmic contact region which are adjacent and co-planar to each other.

The foregoing and other objects, features, and advantages of the invention will be apparent from the following, more particular, description of the preferred embodiments of the invention, as illustrated in the accompanying drawings.

BRIEF DESCRIPTION OF THE SEVERAL VIEWS OF THE DRAWINGS

FIG. 3 is a cross sectional view of a still later stage in the fabrication process in forming the semiconductor structure of the present invention after the photoresist layer is removed and a silicon nitride layer is deposited and after a heat treatment diffusion drive-in operation is used to create the desired depth of the two N+ regions and the P+ region, respectively, comprising the anode, injector and ohmic contact regions in the P well cathode.

FIG. 4 is a cross sectional view of the completed semiconductor diode structure of the present invention showing openings in the silicon nitride layer and a first metal electrode in electrical contact to the N+ anode region and a second metal electrode in electrical contact to both the N+ injector and P+ ohmic contact regions in the P well cathode.

DETAILED DESCRIPTION OF THE INVENTION

Figure 1:
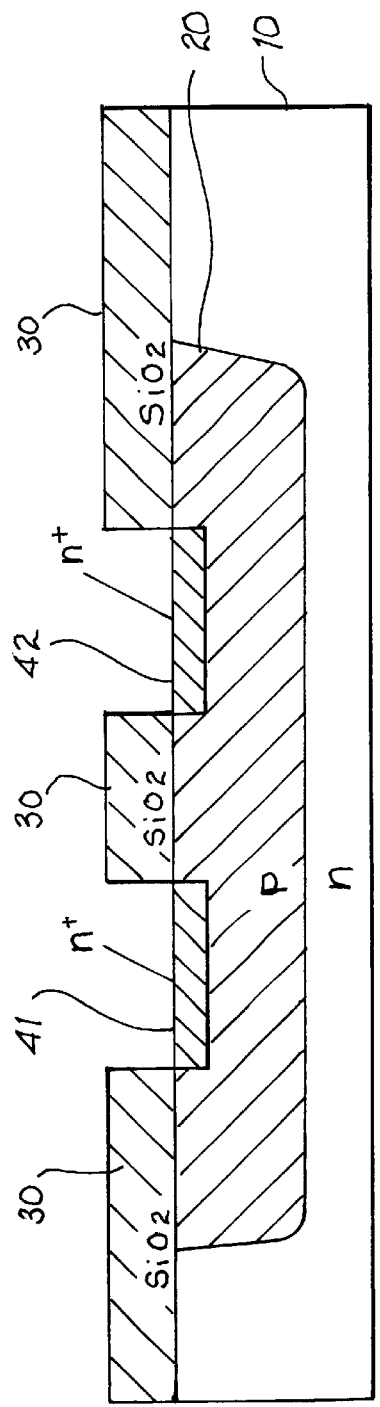
FIG. 1 is a cross sectional view of the semiconductor structure of the present invention in an early stage of the fabrication process depicting a P well cathode in an N type substrate, a silicon dioxide layer located on a surface thereof with apertures therein and spaced apart N+ type regions in the P well cathode.

Referring to FIG. 1, a relatively early phase in the fabrication process of forming the semiconductor structure of the present invention is illustrated. The starting N type silicon substrate 10 contains N type impurities such as arsenic, phosphorous, etc. The substrate 10 is doped to a desired level to provide optimum electrical characteristics for a starting N type substrate.

Initially a P type well cathode 20 is implanted or diffused into the N type substrate 10. The P type well cathode 20 contains P type impurities such as boron. The P type well cathode 20 is doped to a desired level to provide optimum electrical characteristics for a P type well.

Subsequently, a silicon dioxide layer 30 is thermally grown or deposited on the surface of the substrate 10. Standard semiconductor photolithography, i.e. masking and etching using photoresist (not shown), is used to create two apertures in the oxide layer 30 which openings are spaced apart. Subsequently two N+ type regions 41 and 42 are created in the P type well cathode 20 below the two apertures in the oxide layer 30 by ion implantation or diffusion techniques using an N type impurity. The N+ type region 41 forms the anode of a semiconductor diode device as shown in FIG. 4. The N+ type region 42 forms the injector for the semiconductor diode device as shown in FIG. 4.

Figure 2:
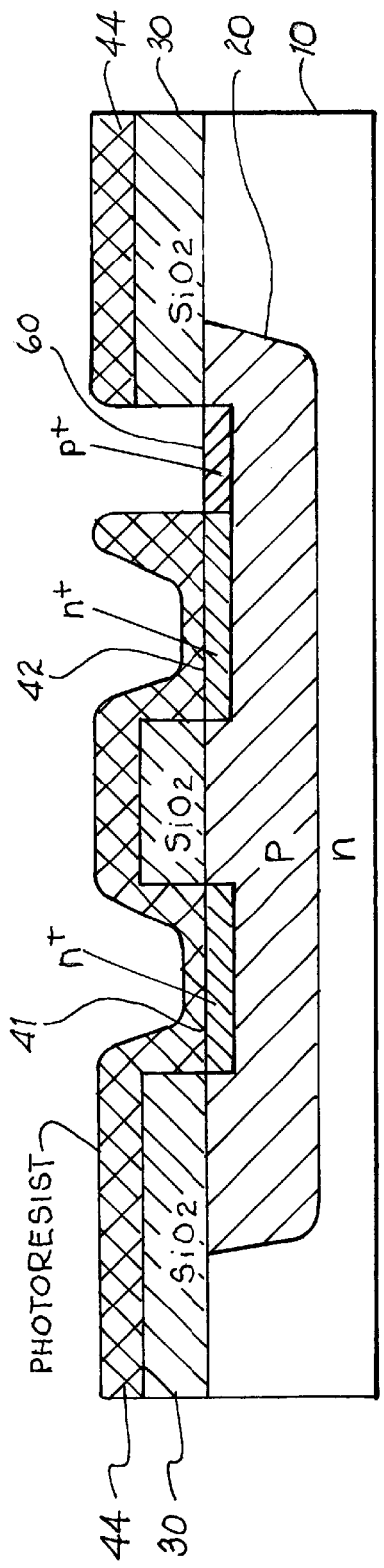
FIG. 2 is a cross sectional view of a later stage in the fabrication process in forming the semiconductor structure of the present invention showing a subsequent addition of a photoresist layer with an aperture therein and through the underlying portion of silicon dioxide to permit the formation in the P well cathode of a P+ type ohmic contact region.

Referring to FIG. 2, a later phase in the semiconductor process for forming the semiconductor structure of the present invention is illustrated. A photoresist (PR) layer 44 is initially deposited over the surface of the semiconductor structure of FIG. 1. Then a single aperture is etched through both the photoresist layer 44 and the underlying portion of the silicon dioxide layer 30 by using photolithographic masking and etching techniques to permit ion implantation or diffusion of a P+ type ohmic contact region 60 into the P type well cathode 20. The P+ type ohmic contact region 60 is preferably adjacent to and in contact with the N+ type injector region 42. The P+ type ohmic contact region 60 is formed to obtain better ohmic contact with the P well cathode 20 as subsequently shown in FIG. 4.

Referring to FIG. 3, another subsequent phase in the process for fabricating the semiconductor structure of the present invention is shown. After the photoresist layer 44 (see FIG. 2) is removed, a silicon nitride deposition operation is conducted to deposit a silicon nitride layer 50. The semiconductor structure is annealed or heat treated at a sufficiently high temperature to drive in the various regions 41, 42 and 60 in the surface portion thereof. Subsequent to the heat treatment, the regions 41, 42 and 60 have a greater depth as shown in FIG. 3 in contrast to the depth as shown in FIG. 2.

Referring to FIG. 4, the completed semiconductor structure and device of the present invention is illustrated. In completing the semiconductor structure, two apertures are etched or formed into the silicon nitride layer 50. The first aperture is etched or formed directly over the N+ type anode region 41. The second aperture is etched or formed directly over, and spanning a portion of both sides of the P-N junction interface of the N+ type injector region 42 and the P+ type ohmic contact region 60. Then, a metal electrode layer, comprising aluminum or an aluminum alloy in the preferred embodiment, is deposited over the nitride layer 50. The metal layer is etched by using photolithographic masking and etching techniques to form an opening therein thereby providing a first metal electrode 68 that makes electrical contact with the N+ type anode region 41 (by penetrating through an aperture previously formed in the silicon nitride layer 50 over the N+ type anode region 41). The deposited metal layer also provides a second metal electrode 70 that makes electrical contact with both the N+ type injector region 42 and the P+ type ohmic contact region 60 by penetrating through a previously formed aperture in the silicon nitride layer 50 over surface portions of the N+ type injector region 42 and the P+ type ohmic contact region 60. Since aluminum tends to create an N type surface inversion, the P+ type ohmic contact region 60 permits a more reliable ohmic contact to be made to the P well cathode 20.

The creation of the N+ type injector region 42 located adjacent to the P+ type ohmic contact region 60 and electrically connected to each other by means of the second metal electrode 70 contacting each of these two regions across the P-N junction between these two regions together with the N+ type anode region 41 serve when combined with the P well cathode region 20 as a protective diode for ESD while simultaneously significantly reducing dimensions as compared to prior art ESD protective devices.

When the breakdown current increases, the N+ type injector 42 begins to introduce minority carriers. By increasing conductivity of the semiconductor diode device, the maximum current that the semiconductor diode can carry without realizing damage is increased. Therefore, with the semiconductor device of the present invention, the high current generated by ESD can be effectively controlled.

Although the invention has been particularly shown and described with reference to a preferred embodiment thereof, it will be understood by those skilled in the art that changes in form and detail may be made therein without departing from the spirit and scope of the invention.

What is claimed is:

1. A semiconductor diode for protection against electrostatic discharge wherein the semiconductor diode is fabricated as part of a monolithic integrated circuit comprising, in combination:
   an N type semiconductor substrate;
   a P well cathode located within the N type semiconductor substrate;
   an N+ type anode region located within the P well cathode;
   an N+ type injector region located within the P well cathode and spaced apart from the N+ type anode region wherein the N+ type injector region begins to introduce minority carriers when the breakdown current increases;

a P+ type ohmic contact region located within the P well cathode, the N+ type injector region and the P+ type ohmic contact region are adjacent and co-planar to each other;

a first metal electrode electrically connected to the N+ type anode region: and a second metal electrode in electrical contact with both the N+ type injector region and the P+ type ohmic contact region.

2. The semiconductor diode in accordance with claim 1 wherein the first metal electrode and the second metal electrode comprise aluminum.

3. The semiconductor diode in accordance with claim 1 wherein the introduction of minority carriers from the N+ type injector region increases conductivity of the semiconductor diode.

4. The semiconductor diode in accordance with claim 3 wherein a maximum current that the semiconductor diode can carry without realizing damage thereto is increased with the increase in the conductivity of the semiconductor diode.

5. The semiconductor diode in accordance with claim 4 wherein the maximum current that the semiconductor diode can carry without realizing damage thereto protects against electrostatic discharge damage.

6. A semiconductor diode for protection against electrostatic discharge comprising, in combination:

a semiconductor substrate of one type conductivity;

a region of opposite type conductivity located within the semiconductor substrate;

a first region of said one type conductivity and having a higher concentration of impurities than the concentration of impurities in the semiconductor substrate located within the region of opposite type conductivity;

an injector region of said one type conductivity and having a higher concentration of impurities than the concentration of impurities in the semiconductor substrate located within the region of opposite type conductivity and spaced apart from the first region;

an ohmic contact region located within the region of opposite type conductivity, the injector region and the ohmic contact region are adjacent and co-planar to each other;

a first metal electrode electrically connected to the first region; and a second metal electrode in electrical contact with both the injector region and the ohmic contact region.

\* \* \* \* \*